United States Patent
Sonobe et al.

(10) Patent No.: US 11,522,123 B2
(45) Date of Patent: Dec. 6, 2022

(54) MAGNETIC MEMORY DEVICE

(71) Applicant: Samsung Electronics Co., Ltd., Suwon-si (KR)

(72) Inventors: Yoshiaki Sonobe, Suwon-si (KR); Syuta Honda, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 182 days.

(21) Appl. No.: 16/997,162

(22) Filed: Aug. 19, 2020

(65) Prior Publication Data

US 2021/0126189 A1 Apr. 29, 2021

(30) Foreign Application Priority Data

Oct. 29, 2019 (JP) .............................. JP2019-196644

(51) Int. Cl.
  *H01L 43/02* (2006.01)
  *H01L 27/22* (2006.01)
  *H01L 43/10* (2006.01)

(52) U.S. Cl.
  CPC ............ *H01L 43/02* (2013.01); *H01L 27/222* (2013.01); *H01L 43/10* (2013.01)

(58) Field of Classification Search
  CPC ........ H01L 43/02; H01L 27/222; H01L 43/10
  See application file for complete search history.

(56) References Cited

U.S. PATENT DOCUMENTS

| 8,830,742 B2 | 9/2014 | Kondo et al. |
| 9,190,168 B2 | 11/2015 | Nakamura et al. |
| 2018/0335973 A1* | 11/2018 | Sato ................ G11C 11/16 |

FOREIGN PATENT DOCUMENTS

| JP | 201380748 A | 5/2013 |
| JP | 2013187257 A | 9/2013 |
| JP | 201663088 A | 4/2016 |
| JP | 2017112351 A | 6/2017 |
| JP | 2017168514 A | 9/2017 |

OTHER PUBLICATIONS

Honda, et al. Skyrmion-Based Racetrack Memory With Continuous Loop Built From Ferromagnetic Metal and Insulator, IEEE Transactions on Magnetics, vol. 55, No. 2, pp. 1-4, Sep. 17, 2018 (Year: 2018).*
Parkin, Data in the Fast Lanes of Racetrack Memory, Scientific American, Jun. 2009 (Year: 2009).*
L. Le Guyader et al., 'Nanoscale sub-100 picosecond all-optical magnetization switching in GdFeCo microstructures' *Nature Communications*, 6:5839, Jan. 2015.

(Continued)

*Primary Examiner* — Shih Tsun A Chou
(74) *Attorney, Agent, or Firm* — Harness, Dickey & Pierce, P.L.C.

(57) ABSTRACT

A magnetic memory device includes a magnetic body having magnetic anisotropy and an insulator including a ferromagnetic element. The magnetic body is structurally connected to both ends of the ferromagnetic insulator, and the magnetic body and the ferromagnetic insulator form a ring shape. An easy axis of the magnetic body is directed in a direction parallel to an opening surface of the ring shape in a whole of the magnetic body.

16 Claims, 9 Drawing Sheets

(56) References Cited

OTHER PUBLICATIONS

M. Kawana et al., 'Magnetic Nanowire Memory Utilizing Motion of Magnetic Domains for Developing a High-speed Recording Device' *NHK Science & Technology Research Laboratories R&D*, No. 160, Nov. 2016.

S. S. Parkin et al., 'Magnetic Domain-Wall Racetrack Memory' *Science*, vol. 320, Apr. 2008.

Y. Kaiya et al., 'Magnetic Domain with Straight Domain Walls Passing through a Ferromagnetic Insulator via Spin-Polarized Current Flowing in a Ferromagnetic Metal' Aug. 2018.

Kab-Jin Kim et al., "Fast domain wall motion in the vicinity of the angular momentum compensation temperature of ferrimagnets", Nature Materials vol. 16, 1187, Dec. 2017.

T. Koyama et al., "Observation of the intrinsic pinning of a magnetic domain wall in a ferromagnetic nanowire", Nature Materials vol. 10, 194, Mar. 2011.

T. Koyama et al., "Current-induced magnetic domain wall motion below intrinsic threshold triggered by Walker breakdown", Nature Nanotechnology | Advance Online Publication, Sep. 2012.

Kab-Jin Kim et al., "Two-barrier stability that allows low-power operation in current-induced domain-wall motion", Nature Communications | 4:2011(2013).

A. Yamaguchi et al., "Real-Space Observation of Current-Driven Domain Wall Motion in Submicron Magnetic Wires", Physical Review Letters vol. 92, No. 7 Feb. 20, 2004.

Hironobu Tanigawa et al., "Current-Driven Domain Wall Motion in CoCrPt Wires with Perpendicular Magnetic Anisotropy", Applied Physics Express 1 (2008) 011301.

Daichi Chiba et al., "Control of Multiple Magnetic Domain Walls by Current in a Co/Ni Nano-Wire", Applied Physics Express 3 (2010) 073004.

S. Fukami et al., "A spin-orbit torque switching scheme with collinear magnetic easy axis and current configuration", Nature Nanotechnology | Advance Online Publication, Mar. 2016.

\* cited by examiner

MAGNETIC MEMORY DEVICE

CROSS-REFERENCE TO RELATED APPLICATION

This U.S. non-provisional patent application claims priority under 35 U.S.C. § 119 to Japanese Patent Application No. 2019-196644, filed on Oct. 29, 2019, in the Japanese Intellectual Property Office, the disclosure of which is hereby incorporated by reference in its entirety.

BACKGROUND

Embodiments of inventive concepts relate to a magnetic memory device.

There is a magnetic memory technique (e.g., a hard disk drive (HDD)) capable of realizing super high-speed writing or recording. A magnetic memory is a device capable of writing 2-bit data using an N pole and a S pole of a magnet. The magnetic memory may essentially write data in a short time of tens of picoseconds or less. A net writing time of the magnetic memory may be faster than that of a semiconductor memory.

A writing capacity of a large-capacity non-volatile memory such as an NAND flash memory has been increased by the development of a three-dimensional technique. However, since the semiconductor memory writes data depending on the amount of charges of a memory cell, a time interval may occur for physically moving electrons.

The magnetic memory changes a direction of the magnet into the N pole or the S pole. In other words, since the magnetic memory changes a magnetization direction of a magnetic body in itself, a time for changing the magnetization direction is very short. However, a writing or recording medium should be rotated and moved using a motor in the magnetic memory such as the HDD. Since the magnetic memory should write/read data by controlling a position of a magnetic head, a writing/reading speed may be limited by an operating speed of a mechanical driving unit. Thus, it is difficult to improve a transfer speed of data.

A magnetic memory without the mechanical driving unit may realize the original high-speed writing performance of the magnetic body. To realize the high-speed writing performance of the magnetic memory, a new principle of accessing magnetization data may be required instead of the mechanical driving unit.

A new phenomenon was discovered recently. According to this phenomenon, a magnetic domain wall is driven by applying a current to a magnetic nanowire having a one-dimensional structure in which a magnetic material is formed in a linear shape of several hundreds of nanometers. It is attempted to electrically access magnetization data using this phenomenon.

A racetrack memory is a memory which has a magnetic nanowire having a U-shaped three-dimensional structure extending in a direction perpendicular to a substrate and uses the magnetic domain wall driving phenomenon. The racetrack memory may generate a magnetic domain in the magnetic nanowire by a write head and may apply a pulse current in a left-right direction. When data to be read exist in an end portion of the magnetic nanowire, an accessing time of the racetrack memory may be a little long. However, the racetrack memory may have a random access function. In addition, a read operation of data may be performed using a magnetic tunnel junction (MTJ) element.

SUMMARY

In a racetrack memory having a magnetic nanowire having a typical three-dimensional structure, a writing capacity of an end portion of the magnetic nanowire may be reduced and a read efficiency of the end portion of the magnetic nanowire may be poor.

In an embodiment, a magnetic memory device may include a magnetic body having magnetic anisotropy and an insulator. The insulator may be arranged so the magnetic body may be structurally connected to both ends of the insulator. The magnetic body and the insulator may form a ring shape. An easy axis of the magnetic body may be directed in a direction parallel to an opening surface of the ring shape in a whole of the magnetic body. The insulator may be formed of a ferromagnetic insulating material.

The magnetic memory device according to embodiments of inventive concepts may efficiently write data and move data to read data, almost all around the ring-shaped magnetic body.

In some embodiments, the magnetic body may include a first portion and a second portion. A magnetization direction in the first portion of the magnetic body may be parallel to a movement direction of a magnetic domain wall in the magnetic body. A magnetization direction in the second portion of the magnetic body may be perpendicular to a movement direction of the magnetic domain wall in the magnetic body.

The magnetic memory device may smoothly change a magnetization direction in a corner portion of the magnetic body.

In an embodiment, a magnetic memory device may include a magnetic body having magnetic anisotropy, insulator including a ferromagnetic element, an insulating layer on the magnetic body, and ferromagnetic layer on the insulating layer. The insulator may be arranged so the magnetic body may be structurally connected to both ends of the insulator. The magnetic body and the insulator may form a ring shape. An easy axis of the magnetic body may be directed in a direction parallel to an opening surface of the ring shape in a whole of the magnetic body.

In the magnetic memory device according to some embodiments of inventive concepts, since the magnetic anisotropy of the ring-shaped magnetic body is perpendicular to a substrate, stacking of the magnetic memory device may be easy.

In some embodiments, the magnetic memory device may further include a pulse power source electrically connected to both ends of the magnetic body and configured to apply a current to the both ends of the magnetic body.

In the magnetic memory device according to some embodiments of inventive concepts, since a magnetic domain wall is moved by the current, a write bit may move.

In some embodiments, the magnetic memory device may further include a substrate in contact with a portion of the magnetic body. A main surface of the substrate may be perpendicular to a magnetization direction of the magnetic body.

In an embodiment, a magnetic memory device may include a substrate; an insulator on the substrate, the insulator including a ferromagnetic element; a first magnetic body and a second magnetic body on the substrate, the first magnetic body and the second magnetic body connected to both ends of the insulator, respectively; a first transfer electrode adjacent to a connection surface of the first magnetic body and the insulator; and a second transfer electrode adjacent to a connection surface of the second magnetic body and the insulator.

In the magnetic memory device according to some embodiments of inventive concepts, the current may flow in a circumferential direction of the ring-shaped magnetic body, and thus the current may flow through a most part of the ring-shaped magnetic body. However, the current may hardly flow in the ferromagnetic insulator.

BRIEF DESCRIPTION OF THE DRAWINGS

Inventive concepts will become more apparent in view of the attached drawings and accompanying detailed description.

DETAILED DESCRIPTION

Hereinafter, embodiments of inventive concepts will be described in detail with reference to the accompanying drawings.

Figure 1:
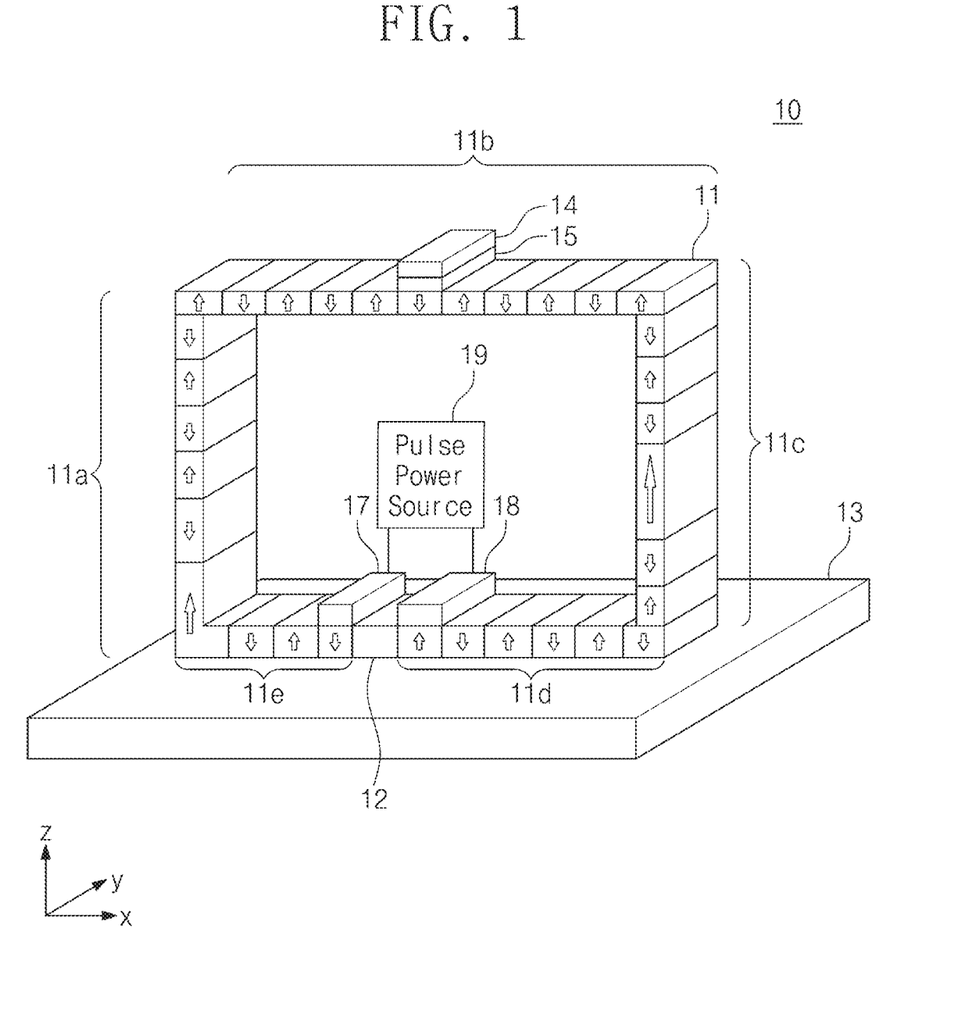
FIG. 1 is a perspective view illustrating a schematic configuration of a magnetic memory device according to some embodiments of inventive concepts.

FIG. 1 is a perspective view illustrating a schematic configuration of a magnetic memory device according to some embodiments of inventive concepts.

Referring to FIG. 1, a magnetic memory device 10 may include a magnetic body 11, an insulator 12, a substrate 13, a pinned layer 14, an insulating layer 15, transfer electrodes 17 and 18, and a pulse power source 19.

The magnetic body 11 may have magnetic anisotropy. For example, the magnetic body 11 may be a ferromagnetic metal. The magnetic body 11 may be a magnetic wire formed of a magnetic material having a fine and long shape. The magnetic body 11 may form a portion of a ring shape. A current may flow in the magnetic body 11 to move a magnetic domain wall (e.g., a boundary between magnetic domains having constant magnetization directions). Thus, the magnetic memory device 10 may function as a magnetic domain wall movement type memory. For example, the magnetic body 11 may include a Co/Ni multi-layer, a CoNi alloy, a Co/Pd multi-layer, a CoPd alloy, a Co/Pt multi-layer, a CoPt alloy, a Tb/FeCo multi-layer, a TbFeCo alloy, a CoFe alloy, a CoFeB alloy, a Fe/Ni multi-layer, or a FeNi alloy.

A direction of an easy axis of the magnetic body 11 may be a direction (e.g., a z-axis direction) parallel to a ring-shaped surface (e.g., a ring-shaped opening surface and/or an xz plane) of the magnetic body 11, in the whole of the ring shape. The magnetic body 11 may include a first magnetic body 11a, a second magnetic body 11b, a third magnetic body 11c, a fourth magnetic body 11d, and a fifth magnetic body 11e. The ring-shaped surface (e.g., the ring-shaped opening surface and/or the xz plane) of the magnetic body 11 may be perpendicular to a main surface (e.g., an xy plane) of the substrate 13.

The first magnetic body 11a and the third magnetic body 11c may extend in the z-axis direction, and easy axes thereof may be parallel to the z-axis direction. In other words, the extending direction of the first magnetic body 11a and the third magnetic body 11c may be the same as a direction of the easy axes thereof.

The second magnetic body 11b, the fourth magnetic body 11d and the fifth magnetic body 11e may extend in an x-axis direction, and easy axes thereof may be parallel to the z-axis direction. In other words, the extending direction of the second magnetic body 11b, the fourth magnetic body 11d and the fifth magnetic body 11e may not be the same as a direction of the easy axes thereof. Referring to FIG. 1, the extending direction of the second magnetic body 11b, the fourth magnetic body 11d and the fifth magnetic body 11e may be perpendicular to the direction of the easy axes thereof.

The insulator 12 may be connected to the magnetic body 11 at both ends of the insulator 12. The magnetic body 11 and the insulator 12 may form a ring shape. The insulator 12 may be a ferromagnetic insulator. The insulator 12 may include a ferromagnetic element. For example, the insulator 12 may be formed of yttrium iron garnet (YIG). Alternatively, the insulator 12 may be formed of $CoFeO_4$ or BaFeO.

The substrate 13 may be a silicon (Si) substrate. Alternatively, the substrate 13 may be a silicon (Si) substrate in which a thermal oxide layer is buried, or a single-crystalline silicon (Si) substrate.

The pinned layer 14 may be a ferromagnetic metal layer of which a magnetization direction is fixed or pinned in one direction. For example, the pinned layer 14 may include a Fe-based material (e.g., CoFeB and/or CoFe), a Co/Pt multi-layer, or a composite layer thereof.

The insulating layer 15 may include an insulating material as a main ingredient. The insulating layer 15 may be disposed between the pinned layer 14 and the magnetic body 11. The insulating layer 15 may be an insulating layer of MgO. For example, the insulating layer 15 may be formed of an oxide having a NaCl structure. Further, the insulating layer 15 may be formed of CaO, SrO, TiO, VO, or NbO, in addition to MgO. However, in a certain embodiment, the insulating layer 15 may be formed of other material functioning as the insulating layer 15. For example, the insulating layer 15 may be formed of spinel-type $MgAl_2O_4$.

The pinned layer 14, the insulating layer 15 and the magnetic body 11 may constitute a magnetic tunnel junction, and the magnetic tunnel junction may function as an element of performing at least one of a write operation or a read operation.

A voltage perpendicular to a surface may be applied between the pinned layer 14 and the magnetic body 11. In this case, a current may flow between the pinned layer 14 and the magnetic body 11 by a tunnel effect.

A first transfer electrode 17 may be provided on an end of the magnetic body 11 and may be disposed in the ring-shaped opening. For example, the first transfer electrode 17 may include a non-magnetic metal.

A second transfer electrode 18 may be provided on another end of the magnetic body 11 and may be disposed in the ring-shaped opening. For example, the second transfer electrode 18 may include a non-magnetic metal.

The pulse power source 19 may be connected to the first and second transfer electrodes 17 and 18. The pulse power source 19 may apply a pulse current to the first and second transfer electrodes 17 and 18. Since the pulse power source 19 is connected to the first and second transfer electrodes 17 and 18 respectively disposed at both ends of the magnetic body 11 with the insulator 12 interposed therebetween, the magnetic domain wall may move over (or through) the insulator 12.

In some embodiments, the pulse power source 19 may supply a constant current by using a direct current (DC) power source. The pulse power source 19 may be embodied as power supply circuit and, in some embodiments, may include a battery and/or other circuit for supplying electrical power, but example embodiments are not limited thereto.

To precisely control a position of the magnetic domain, a waveform of the current of the pulse power source 19 may be close to a rectangular shape in ON-OFF of the current. For example, when a current applying time required to move the magnetic domain by a 1 bit length is 't', an applying time of a direct current may be 'nt' (e.g., integer multiple of 't'). The pulse power source 19 may apply a voltage, appropriate for a current value capable of driving the magnetic domain, to the magnetic body 11. For example, the voltage may be determined by a resistance value of the magnetic body 11 and a movement speed of the magnetic domain wall.

The magnetic memory device according to the embodiments of inventive concepts may be configured or realized as described above.

Figure 2:
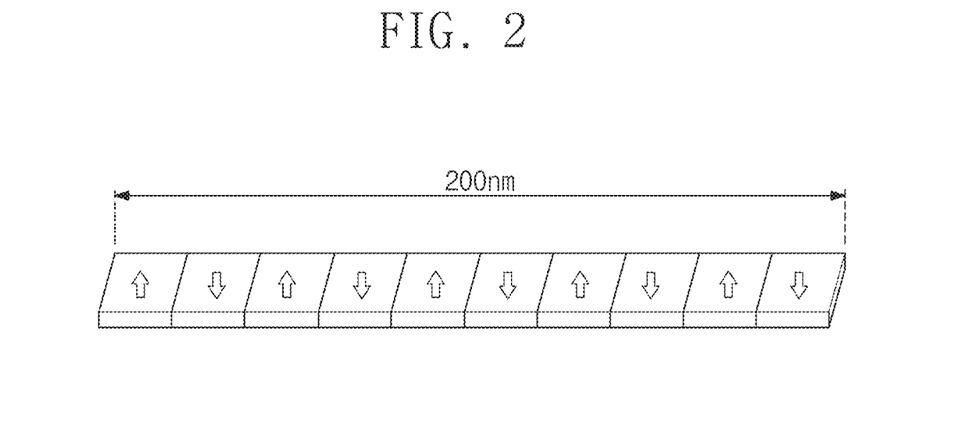
FIG. 2 is a schematic view illustrating a magnetic domain pattern state of a magnetic memory device according to some embodiments of inventive concepts.

Next, operation of the magnetic memory device 10 will be described. A Landau Lifshitz Gilbert (LLG) simulation was performed using a stripe-shaped magnetic domain structure magnetized perpendicularly to a surface as an initial state, and then, stability was checked. FIG. 2 is a schematic view illustrating a magnetic domain pattern state of the magnetic memory device 10 according to some embodiments of inventive concepts. The magnetic body 11 illustrated in FIG. 2 has a magnetic wire having a length of 200 nm, a width of 10 nm, and a thickness of 2 nm. Arrows illustrated in FIG. 2 show directions of magnetic moments magnetized perpendicularly to the surface. The simulation was performed under a condition of memorizing data of 10 bits in the magnetic wire. Magnetic parameters of the magnetic body were a saturation magnetization (MS) of 300 kA/m, an exchange stiffness constant of 1.0 pJ/m, a perpendicular magnetic anisotropy of 100 kJ/$m^3$, and a Dzyaloshinskii-Moriya interaction (DMI) constant of 0.015 mJ/$m^2$. As a result of the simulation under the above conditions, the state was stable while maintaining the number of bits of the initial state.

Figure 3:
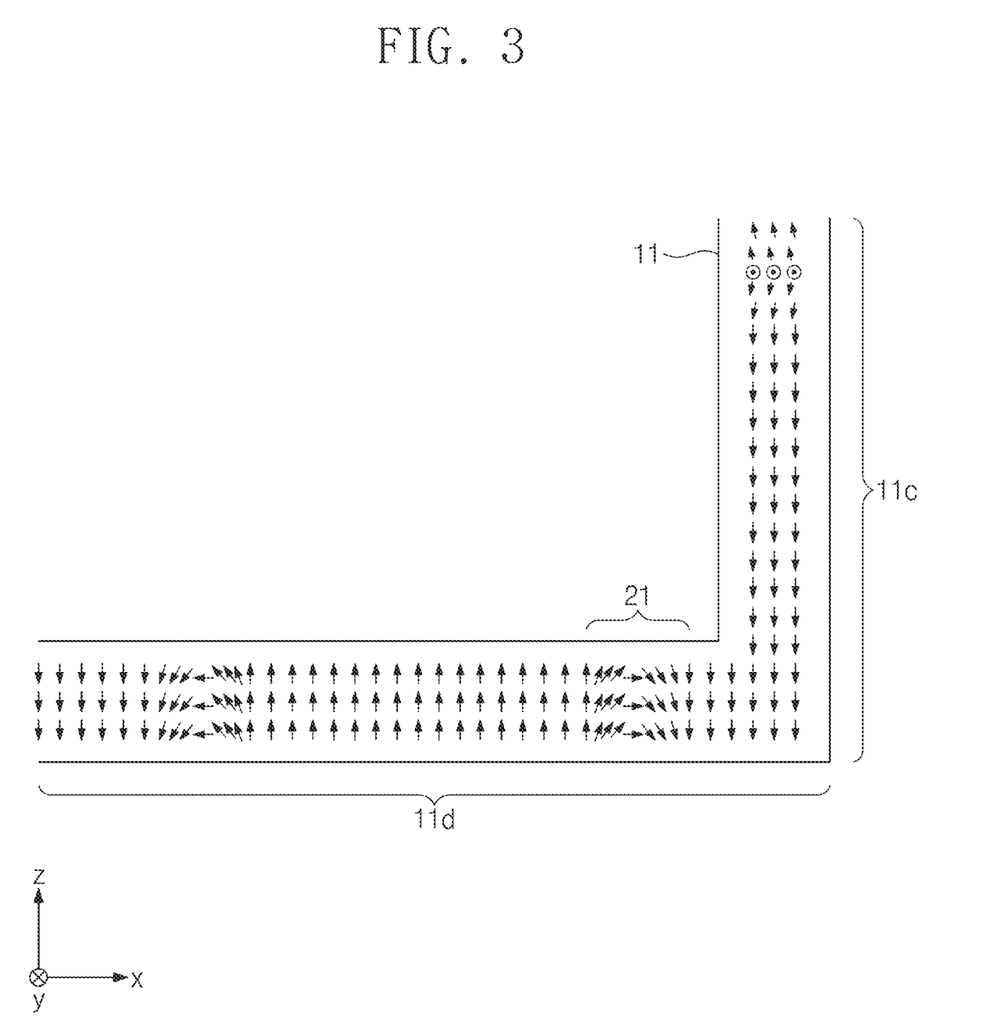
FIG. 3 is a schematic view illustrating a magnetic domain wall state of a magnetic memory device according to some embodiments of inventive concepts.
Figure 4:
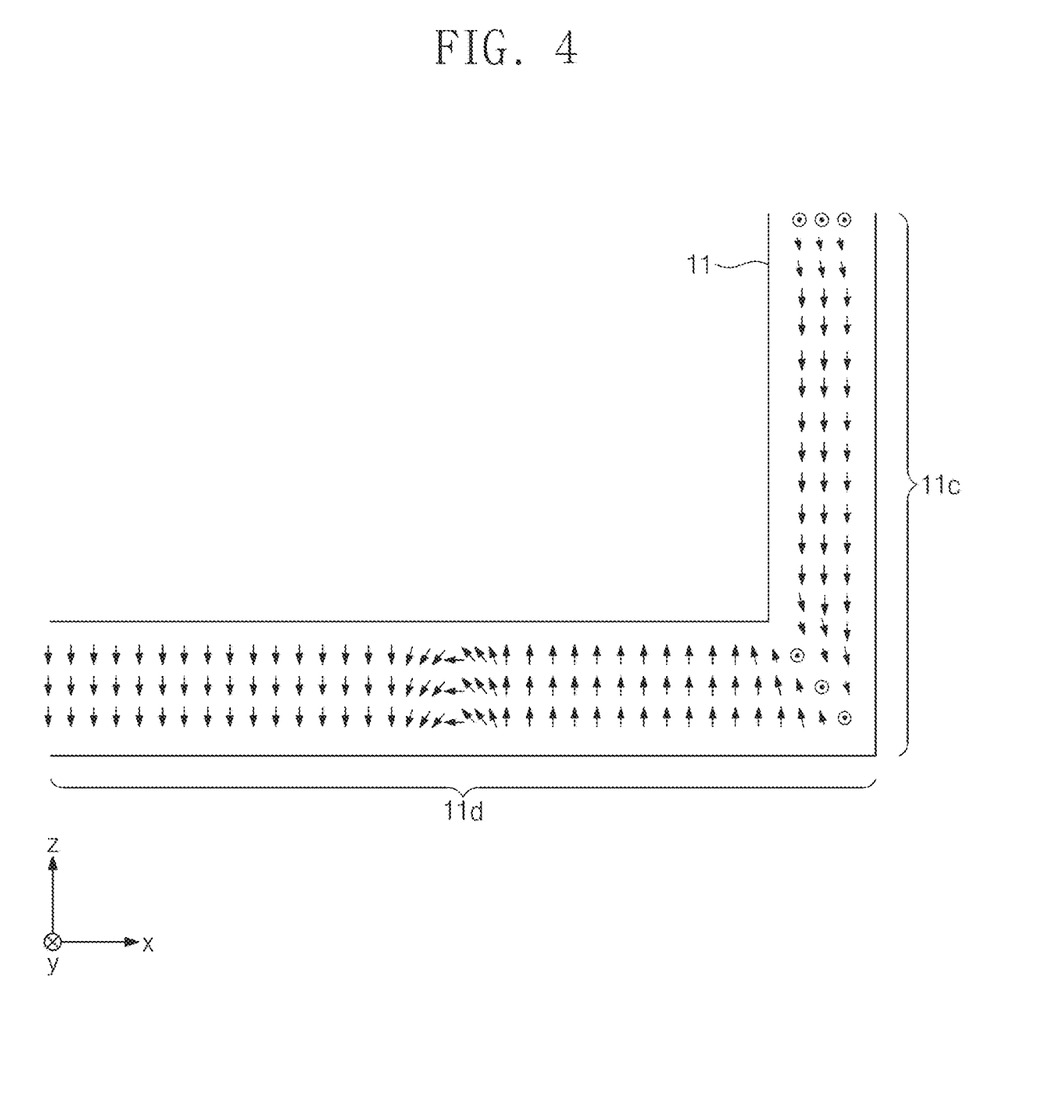
FIG. 4 is a schematic view illustrating a magnetic domain wall state of a magnetic memory device according to some embodiments of inventive concepts.
Figure 5:
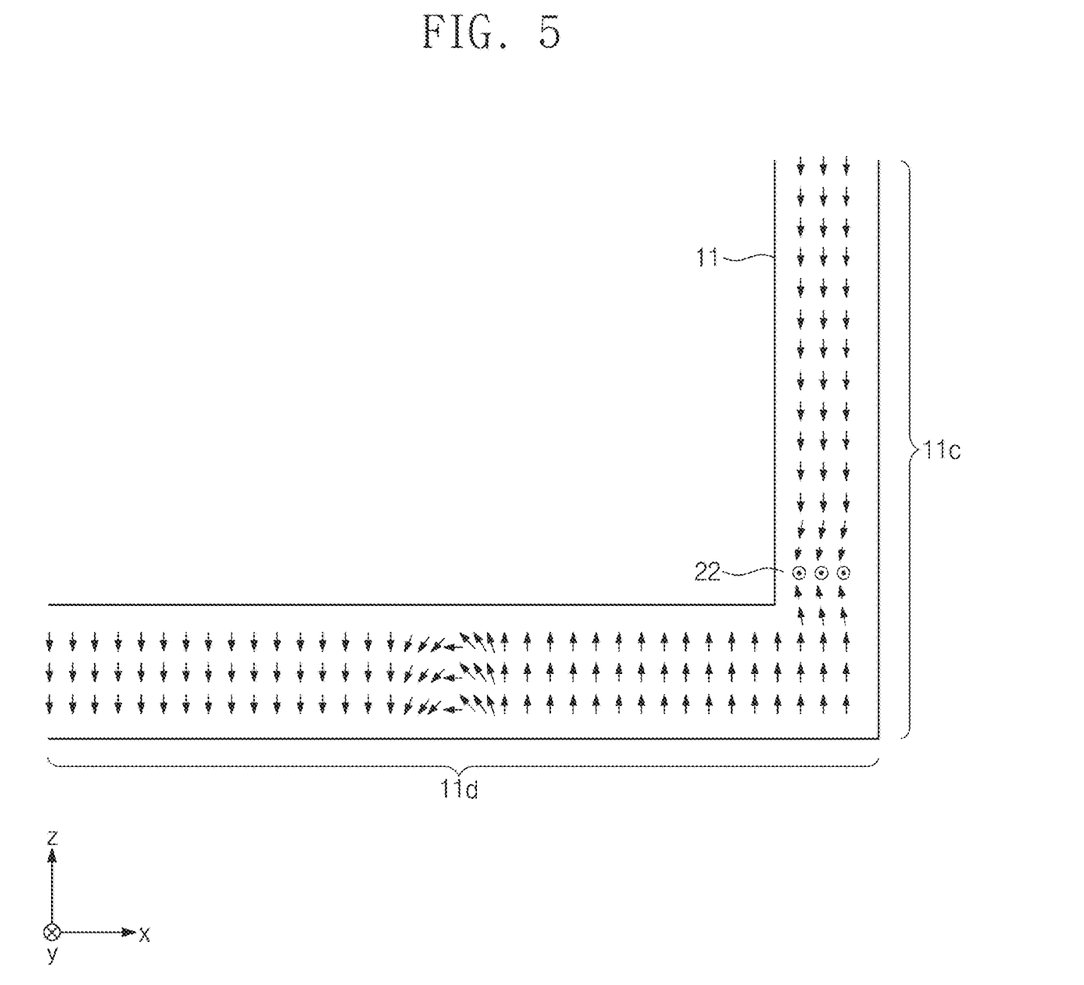
FIG. 5 is a schematic view illustrating a magnetic domain wall state of a magnetic memory device according to some embodiments of inventive concepts.

Next, behavior of the magnetic domain wall in a portion in which the magnetization direction of the magnetic body is changed will be described. FIGS. 3 to 5 are schematic views illustrating magnetic domain wall states of the magnetic memory device 10 according to some embodiments of inventive concepts.

Referring to FIG. 3, a Neel domain wall 21 moves in the x-axis direction in the fourth magnetic body 11*d*. The magnetic domain wall continuously moves to reach a boundary between the fourth magnetic body 11*d* extending in the x-axis direction and the third magnetic body 11*c* extending in the z-axis direction.

FIG. 4 illustrates a state in which the magnetic domain wall reaches the boundary between the fourth magnetic body 11*d* and the third magnetic body 11*c*. Referring to FIG. 4, the magnetic domain wall in the boundary between the fourth magnetic body 11*d* and the third magnetic body 11*c* is an intermediate state between the Neel domain wall and a Bloch domain wall.

Referring to FIG. 5, a Bloch domain wall 22 moves in the z-axis direction in the third magnetic body 11*c*. The magnetic domain wall moves to turn along the magnetic body 11.

The magnetic domain wall may move to turn along the magnetic body 11 by the above operation, and thus magnetization data may be looped.

In a case of driving a three-dimensional magnetic domain wall, one magnetic domain wall should be changed to 90 degrees while maintaining the same magnetic domain wall shape at a corner. However, when the magnetic domain wall moves near a corner of the magnetic body 11 of the magnetic memory device according to the embodiments of inventive concepts, the magnetic domain wall moves at the corner of the magnetic body 11 while the shape of the magnetic domain wall is changed.

As a result, the magnetic domain wall may not need to maintain its shape at the corner and may smoothly move at each portion of the magnetic body 11.

As described above, the magnetic memory device 10 according to the embodiments of inventive concepts may efficiently write data almost all around the ring-shaped magnetic body 11 and may smoothly move the magnetic domain wall to read data.

In the magnetic memory device 10 according to the embodiments of inventive concepts, the magnetic anisotropy of the ring-shaped magnetic body 11 may be parallel to the direction perpendicular to the substrate 13, and thus stacking of the magnetic memory device 10 may be easy.

In a typical racetrack memory having a magnetic wire of a three-dimensional structure, a write density of an end portion of the magnetic wire may be low and a read efficiency may be poor. On the contrary, the magnetic memory device 10 according to the embodiments of inventive concepts may efficiently write data almost all around the ring-shaped magnetic body 11 by using the ferromagnetic insulator as the insulator 12 and may move the magnetic domain wall to read data.

However, inventive concepts are not limited to the above embodiments, and the embodiments may be variously changed or modified without departing from the spirits and scopes of inventive concepts. For example, the shape of the magnetic body 11 may be a polygonal ring shape, a circular ring shape, or a ring shape formed by a combination of a straight line and a curved line.

Figure 6A:
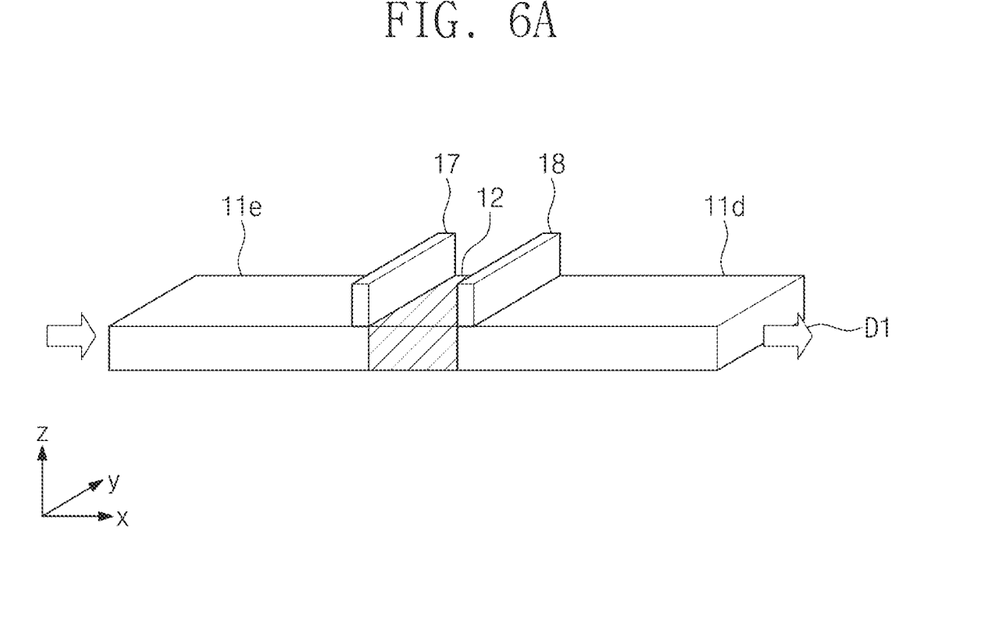
FIG. 6A is a schematic view illustrating a portion of a magnetic body of a magnetic memory device according to some embodiments of inventive concepts.
Figure 6B:
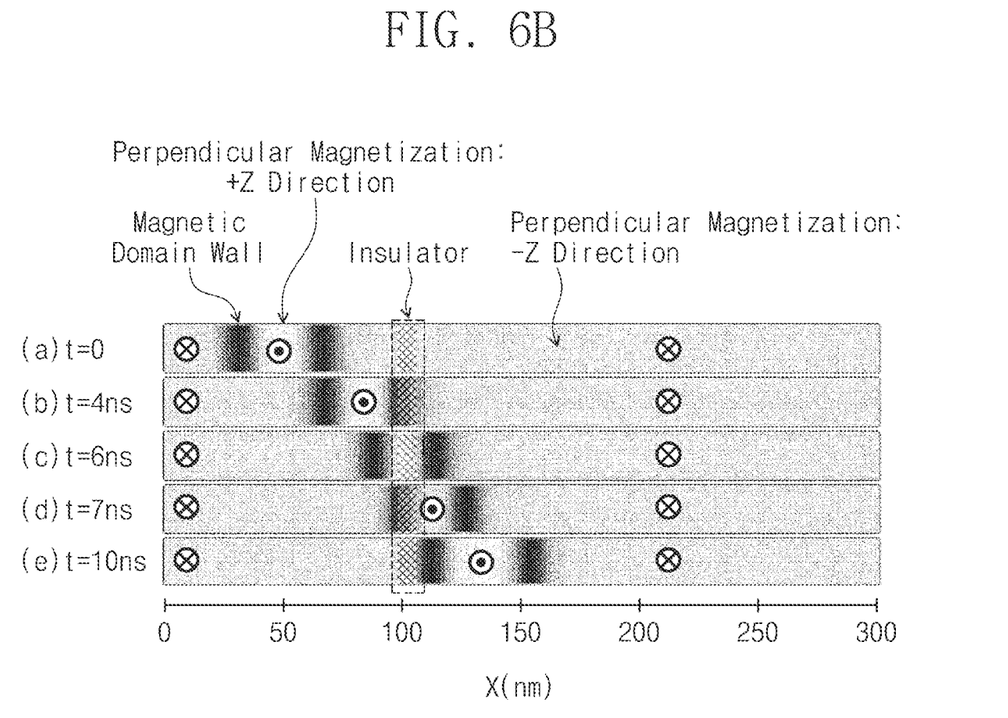
FIG. 6B is a result of a Landau-Lifshitz-Gilbert (LLG) simulation, which shows that a magnetic domain and a magnetic domain wall moving in a magnetic body pass through an insulator.

FIG. 6A is a schematic view illustrating a portion of the magnetic body 11 of the magnetic memory device 10 according to some embodiments of inventive concepts, and FIG. 6B is a result of a Landau-Lifshitz-Gilbert (LLG) simulation, which shows that a magnetic domain and a magnetic domain wall moving in the magnetic body 11 pass through the insulator 12.

Referring to FIGS. 6A and 6B, a ferromagnetic wire has a total length of 300 nm, a width of 20 nm, and a thickness of 4 nm. The ferromagnetic wire may include the fifth magnetic body 11e having a length of 100 nm, the insulator 12 (a hatched portion) having a length of 8 nm, and the fourth magnetic body 11d having a length of 192 nm, from a left side.

In an initial magnetization state (t=0), a most part of the ferromagnetic wire has magnetization in a −Z direction (e.g., a downward direction of a paper surface). A magnetic domain (+Z direction (e.g., upward direction of the paper surface)) having a length of 35 nm is formed at a position 50 nm from a left side of the ferromagnetic wire. A magnetic domain wall (e.g., a dark gray portion) of about 10 nm is formed at each of left and right sides of the magnetic domain. When a current having a current density of $10^{10}$ A/m$^2$ flows from the first transfer electrode 17 to a left side of the fifth magnetic body 11e and from a right side of the fourth magnetic body 11d to the second transfer electrode 18, the magnetic domain moves to the right (e.g., a direction D1 in which electrons flow). At this time, the current did not flow in the insulator 12 of the ferromagnetic insulator. At t=4 ns after the start of applying the current, the right magnetic domain wall reaches the insulator 12 (see (b) of FIG. 6B). Thereafter, the magnetic domain wall and the magnetic domain continuously move to the right, and the magnetic domain passes through a right side of the insulator 12 at t=10 ns (see (e) of FIG. 6B). As described above, in joining (or connection) of the ferromagnetic metal and the ferromagnetic insulator, the magnetic domain passes through the ferromagnetic insulator by the current flowing through the ferromagnetic metal. The magnetic memory device having a circulation structure may be realized by this technique.

In the above embodiments, the magnetic body 11 and the insulator 12 are connected to each other at a vertical surface. Alternatively, the magnetic body 11 and the insulator 12 may be connected to each other at an inclined surface or a side surface. An example of a detailed connection form will be described hereinafter.

Figure 7:
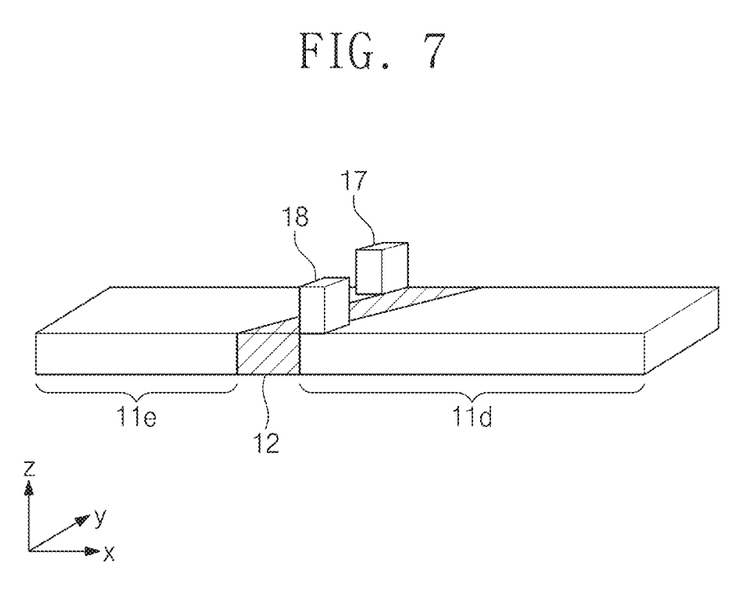
FIG. 7 is a partial view illustrating a connection of a magnetic body and an insulator of a magnetic memory device according to some embodiments of inventive concepts.

FIG. 7 is a partial view illustrating a connection of a magnetic body and an insulator of a magnetic memory device according to some embodiments of inventive concepts.

Referring to FIG. 7, a connection surface of the fourth magnetic body 11d and the insulator 12 may have an angle inclined with respect to the extending direction of the fourth magnetic body 11d. For example, in FIG. 1, a connection surface of the fourth magnetic body 11d and the insulator 12 is in a yz plane perpendicular to the extending direction (e.g., the x-axis direction) of the fourth magnetic body 11d. In FIG. 7, the connection surface of the fourth magnetic body 11d and the insulator 12 has an angle greater than 0 degree and less than 90 degrees with respect to the extending direction (e.g., the x-axis direction) of the fourth magnetic body 11d. Like this, a connection surface of the fifth magnetic body 11e and the insulator 12 also has an angle greater than 0 degree and less than 90 degrees with respect to the extending direction (e.g., the x-axis direction) of the fifth magnetic body 11e. Referring to FIG. 7, the second transfer electrode 18 may be disposed adjacent to the connection surface of the fourth magnetic body 11d and the insulator 12, and the first transfer electrode 17 may be disposed adjacent to the connection surface of the fifth magnetic body 11e and the insulator 12.

Figure 8A:
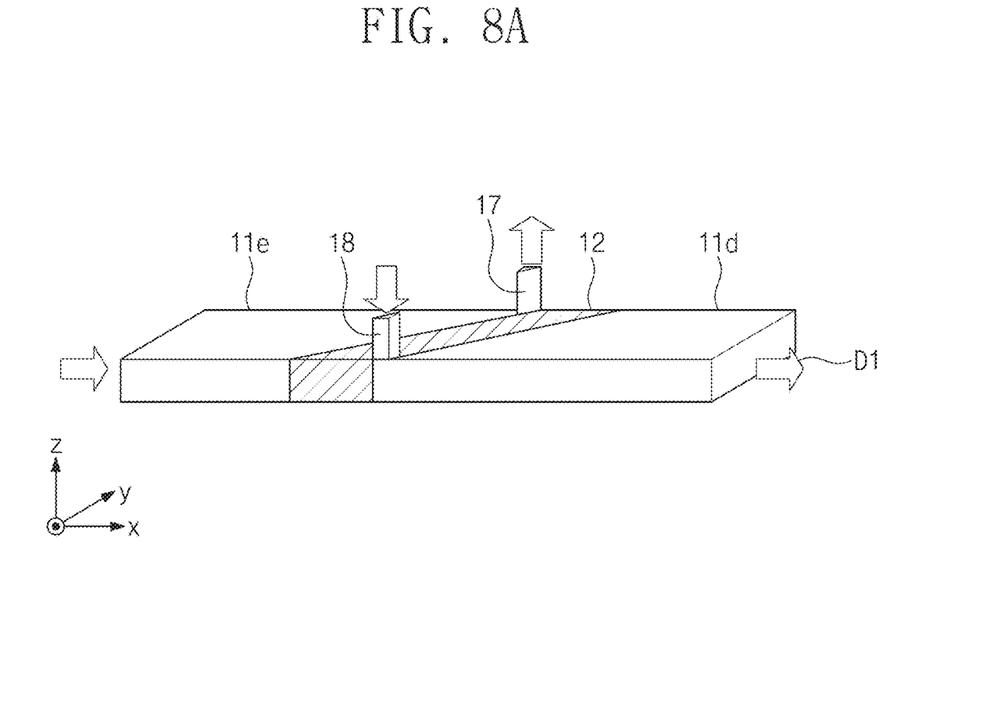
FIG. 8A is a schematic view illustrating a portion of a magnetic body of a magnetic memory device according to some embodiments of inventive concepts.
Figure 8B:
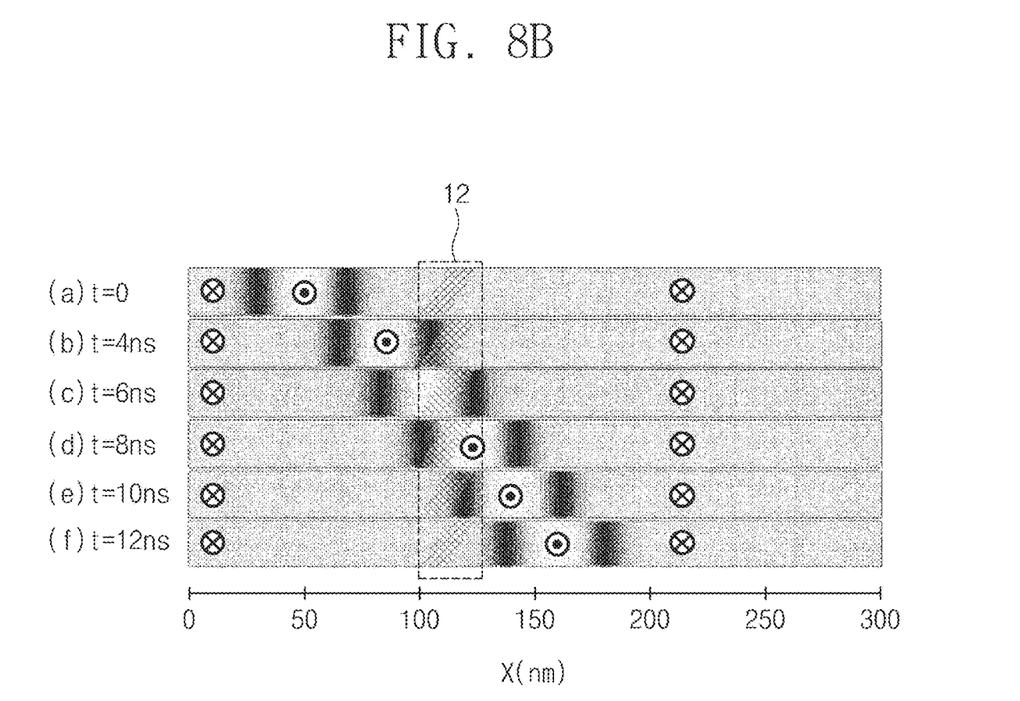
FIG. 8B is a result of a LLG simulation of a magnetic wire in which a connection surface of a magnetic body and an insulator has an angle inclined with respect to an extending direction of the magnetic body.

FIG. 8A is a schematic view illustrating a portion of a magnetic body of a magnetic memory device according to some embodiments of inventive concepts, and FIG. 8B is a result of a LLG simulation of a magnetic wire in which a connection surface of a magnetic body (ferromagnetic body) and an insulator has an angle inclined with respect to an extending direction of the ferromagnetic body. In FIGS. 8A and 8B, a hatched region of x=100 nm to 120 nm illustrates the insulator 12. The fifth magnetic body 11e is disposed at a left side of the insulator 12, and the fourth magnetic body 11d is disposed at a right side of the insulator 12.

Referring to FIGS. 8A and 8B, in an initial magnetization state (t=0), magnetization of a most part of the ferromagnetic wire is directed in the −Z direction (e.g., the downward direction of the paper surface). A magnetic domain (+Z direction (e.g., the upward direction of the paper surface)) having a length of 35 nm is formed at a position of x=50 nm (see (a) of FIG. 8B). A magnetic domain wall (e.g., a dark gray portion) of about 10 nm is formed at each of left and right sides of the magnetic domain. When a current having a current density of $10^{10}$ A/m$^2$ flows from the first transfer electrode 17 to a left side of the fifth magnetic body 11e and from a right side of the fourth magnetic body 11d to the second transfer electrode 18, the magnetic domain moves to the right (e.g., a direction D1 in which electrons flow). At this time, the current did not flow in the insulator 12. At t=4 ns after the start of applying the current, the right magnetic domain wall reaches the insulator 12 (see (b) of FIG. 8B). Thereafter, the magnetic domain wall and the magnetic domain continuously move to the right. At t=10 ns, the magnetic domain passes through a right side of the insulator 12 (see (e) of FIG. 8B). At t=12 ns, the left magnetic domain wall passes through the right side of the insulator 12 (see (f) of FIG. 8B). In the LLG simulation showing the passing of the magnetic domain wall, a movement speed of the magnetic domain passing through the insulator 12 in the structure of FIGS. 8A and 8B is not reduced as compared with the structure of FIGS. 6A and 6B.

Figure 9:
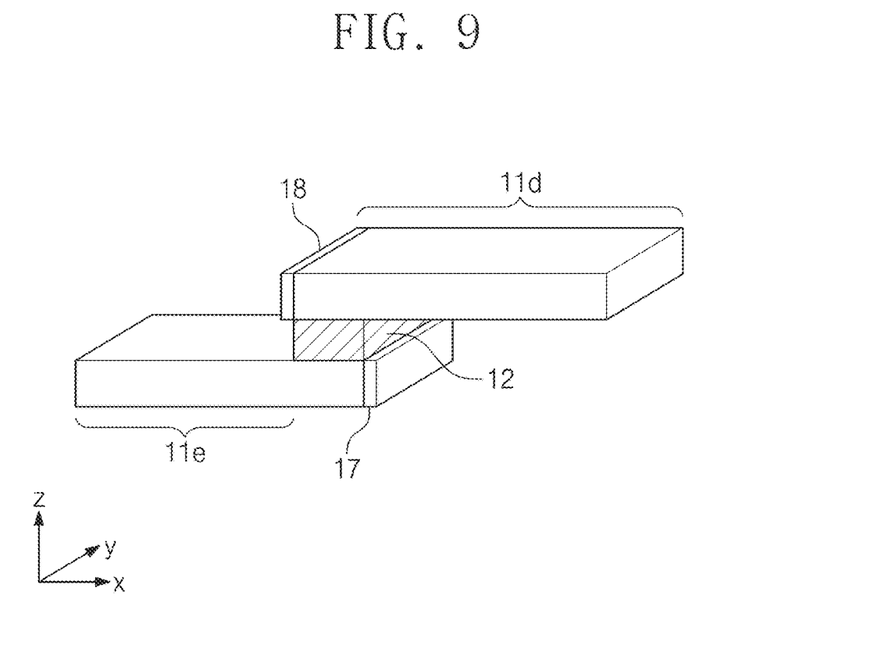
FIG. 9 is a partial view illustrating a connection of a magnetic body and an insulator of a magnetic memory device according to some embodiments of inventive concepts.

FIG. 9 is a partial view illustrating a connection of a magnetic body and an insulator of a magnetic memory device according to some embodiments of inventive concepts.

Referring to FIG. 9, the fifth magnetic body 11e, the insulator 12 and the fourth magnetic body 11d may be sequentially stacked and may be connected to each other. A stacking direction is the z-axis direction perpendicular to the extending direction (e.g., the x-axis direction) of the fourth and fifth magnetic bodies 11d and 11e. The second transfer electrode 18 may be disposed on an end surface of the fourth magnetic body 11d in the extending direction (e.g., the x-axis direction). The first transfer electrode 17 may be disposed on an end surface of the fifth magnetic body 11e in the extending direction (e.g., the x-axis direction).

Figure 10:
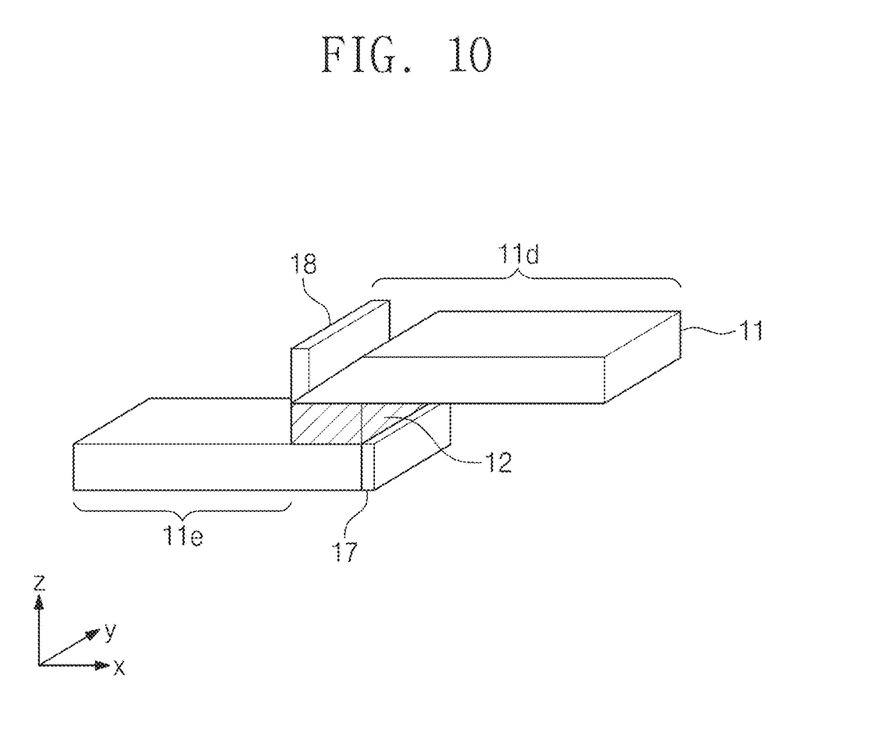
FIG. 10 is a partial view illustrating a connection of a magnetic body and an insulator of a magnetic memory device according to some embodiments of inventive concepts.

FIG. 10 is a partial view illustrating a connection of a magnetic body and an insulator of a magnetic memory device according to some embodiments of inventive concepts.

Referring to FIG. 10, the fifth magnetic body 11e, the insulator 12 and the fourth magnetic body 11d may be sequentially stacked and may be connected to each other. A stacking direction is the z-axis direction perpendicular to the extending direction (e.g., the x-axis direction) of the fourth and fifth magnetic bodies 11d and 11e. An end surface of the fourth magnetic body 11d may have an angle inclined with respect to the extending direction (e.g., the x-axis direction) of the fourth magnetic body 11d. For example, the end surface of the fourth magnetic body 11d may have an angle greater than 0 degree and less than 90 degrees with respect to the extending direction (e.g., the x-axis direction) of the fourth magnetic body 11d. The second transfer electrode 18 may be disposed on the end surface of the fourth magnetic body 11d in the extending direction (e.g., the x-axis direction). The first transfer electrode 17 may be disposed on an end surface of the fifth magnetic body 11e in the extending direction (e.g., the x-axis direction).

A cross-sectional shape of the magnetic body 11 is not limited to a specific example. For example, the cross-sectional shape of the magnetic body 11 may be a circular shape, an elliptical shape, a polygonal shape, or a combination thereof.

Figure 11:
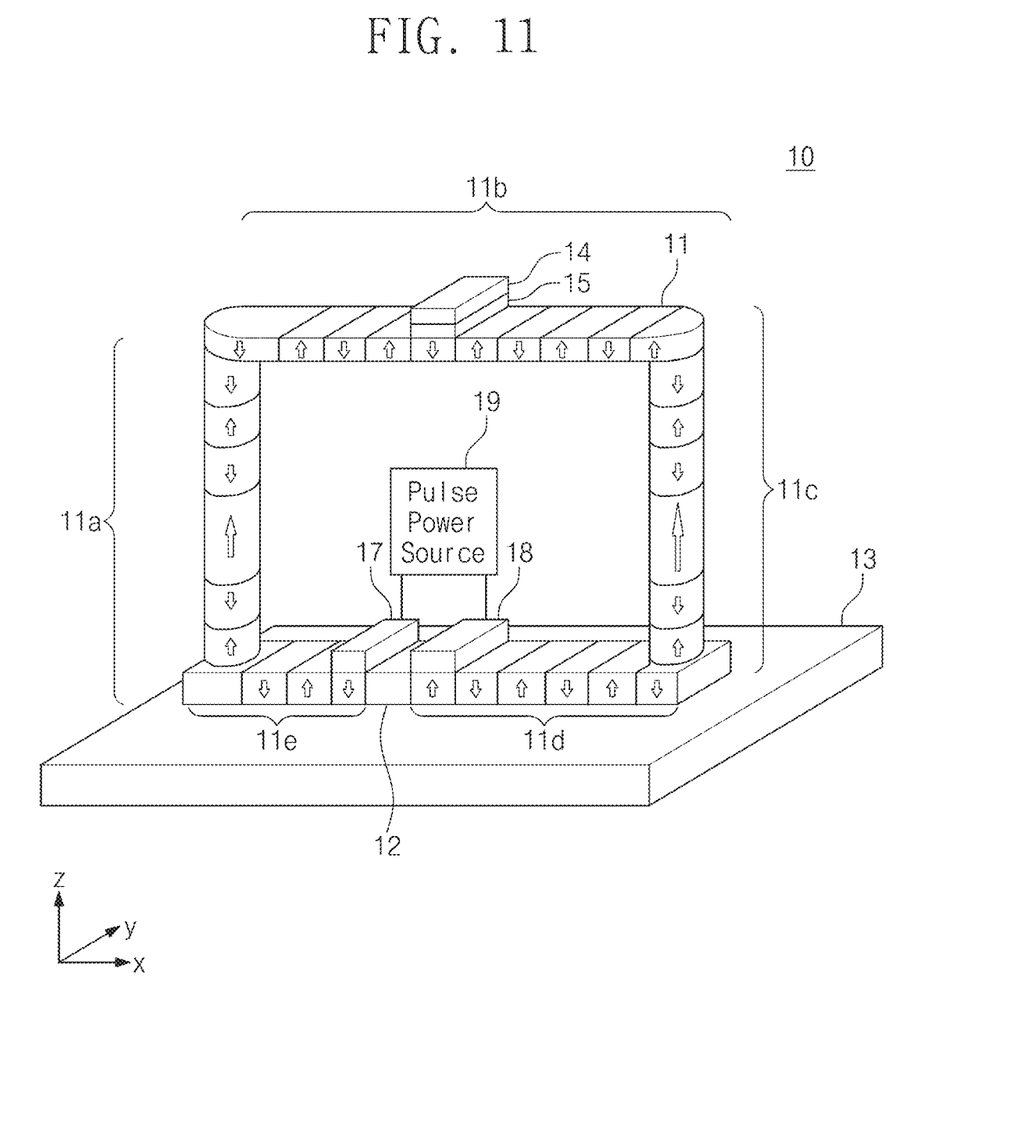
FIG. 11 is a perspective view illustrating a magnetic memory device according to some embodiments of inventive concepts.

FIG. 11 is a perspective view illustrating a magnetic memory device according to some embodiments of inventive concepts. Referring to FIG. 11, the first magnetic body 11a and the third magnetic body 11c may have cylindrical shapes. In other words, cross sections of the first and third magnetic bodies 11a and 11c may have circular shapes.

FIGS. 1 and 11 illustrate the embodiments in which the transfer electrodes 17 and 18 are disposed on the portion of the magnetic body 11 which extends in the x-axis direction. Alternatively, the transfer electrodes 17 and 18 may be disposed on the portion of the magnetic body 11 which extends in the z-axis direction. FIGS. 1 and 11 illustrate the embodiments in which the pinned layer 14 and the insulating layer 15 are disposed on the portion of the magnetic body 11 which extends in the x-axis direction. Alternatively, the pinned layer 14 and the insulating layer 15 may be disposed on the portion of the magnetic body 11 which extends in the z-axis direction.

FIG. 1 illustrates the embodiment in which widths of the first to fifth magnetic bodies 11a, 11b, 11c, 11d and 11e are equal to each other. Alternatively, widths of the first to fifth magnetic bodies 11a, 11b, 11c, 11d and 11e may be different from each other. For example, the third magnetic body 11c and the fourth magnetic body 11d may have different widths from each other in a connection portion of the third magnetic body 11c and the fourth magnetic body 11d of FIG. 11. Portions of the magnetic bodies may overlap with each other in the connection portion.

The first magnetic body 11a, the second magnetic body 11b, the third magnetic body 11c, the fourth magnetic body 11d and the fifth magnetic body 11e may include different magnetic materials from each other.

Although not illustrated, an electronic device may include a memory controller and the magnetic memory device 10 according to example embodiments. The memory controller may control operations (e.g., read, write, etc.) of the magnetic memory device 10 according to example embodiments. The memory controller may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory controller may operate in response to control signals, commands, or instructions input thereto from an external source (e.g., host, not shown) and may be configured to access the magnetic memory device 10 and control operations of the magnetic memory device 10, including the pulse power source 19, discussed herein, thereby transforming the memory controller into a special purpose controller.

The magnetic memory device according to inventive concepts may efficiently write data almost all around the ring-shaped magnetic body. In addition, the magnetic memory device may smoothly move and read data by using the ring-shaped magnetic body having the magnetic anisotropy in the same direction.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A magnetic memory device comprising:
a magnetic body having magnetic anisotropy; and
an insulator including a ferromagnetic element,
the insulator arranged so the magnetic body is structurally connected to both ends of the insulator,
the insulator and the magnetic body forming a ring shape, and
an easy axis of the magnetic body having a direction parallel to an opening surface of the ring shape in a whole of the magnetic body.

2. The magnetic memory device of claim 1, wherein
the magnetic body includes a first portion and a second portion,
a magnetization direction in the first portion of the magnetic body is parallel to a first movement direction of a magnetic domain wall in the magnetic body, and
a magnetization direction in the second portion of the magnetic body is perpendicular to a second movement direction of the magnetic domain wall in the magnetic body.

3. The magnetic memory device of claim 1, further comprising:
a pinned layer; and
an insulating layer, wherein
the pinned layer, the insulating layer, and the magnetic body constitutes a magnetic tunnel junction.

4. The magnetic memory device of claim 3, wherein
the insulating layer is between the magnetic body and the pinned layer, and the magnetic tunnel junction is configured to perform at least one of a read operation or a write operation.

5. A magnetic memory device comprising:
a magnetic body having magnetic anisotropy;
an insulator including a ferromagnetic element, the insulator arranged so the magnetic body is structurally connected to both ends of the insulator, the magnetic body and the insulator forming a ring shape, and an easy axis of the magnetic body having a direction parallel to an opening surface of the ring shape in a whole of the magnetic body;
an insulating layer on the magnetic body; and
a ferromagnetic layer on the insulating layer.

6. The magnetic memory device of claim 5, further comprising:

a pulse power source electrically connected to both ends of the magnetic body, the pulse power source being configured to apply a voltage to the both ends of the magnetic body.

7. The magnetic memory device of claim 6, further comprising:
a substrate in contact with a portion of the magnetic body, a main surface of the substrate being perpendicular to a magnetization direction of the magnetic body.

8. The magnetic memory device of claim 5, further comprising:
a substrate in contact with a portion of the magnetic body, a main surface of the substrate being perpendicular to a magnetization direction of the magnetic body.

9. A magnetic memory device comprising:
a substrate;
an insulator on the substrate, the insulator including a ferromagnetic element;
a magnetic body comprising a first magnetic body and a second magnetic body on the substrate, the first magnetic body and the second magnetic body connected to both ends of the insulator, respectively;
a first transfer electrode adjacent to a connection surface of the first magnetic body and the insulator;
a second transfer electrode adjacent to a connection surface of the second magnetic body and the insulator;
a pinned layer; and
an insulating layer, wherein
the pinned layer, the insulating layer, and the magnetic body constitutes a magnetic tunnel junction.

10. The magnetic memory device of claim 9, wherein the magnetic body further comprises:
a third magnetic body extending in a first direction perpendicular to a top surface of the substrate, the third magnetic body being on the first magnetic body,
a fourth magnetic body extending in the first direction, the fourth magnetic body being on the second magnetic body, and
a fifth magnetic body between the third magnetic body and the fourth magnetic body,
wherein the first magnetic body, the second magnetic body and the fifth magnetic body extend in a second direction parallel to the top surface of the substrate, and the first magnetic body, the second magnetic body, the third magnetic body, the fourth magnetic body, and the fifth magnetic body are connected to each other.

11. The magnetic memory device of claim 10, wherein the insulator, the first magnetic body, the second magnetic body, the third magnetic body, the fourth magnetic body, and the fifth magnetic body are connected to each other to constitute a ring shape.

12. The magnetic memory device of claim 10, wherein the pinned layer is on at least one of the first magnetic body, the second magnetic body, the third magnetic body, the fourth magnetic body, and the fifth magnetic body.

13. The magnetic memory device of claim 12, wherein the insulating layer is between the pinned layer and the at least one of the first magnetic body, the second magnetic body, the third magnetic body, the fourth magnetic body, and the fifth magnetic body.

14. The magnetic memory device of claim 9, further comprising:
a pulse power source connected to the first transfer electrode and the second transfer electrode.

15. The magnetic memory device of claim 9, wherein the magnetic body further comprises:
a third magnetic body extending in a first direction perpendicular to a top surface of the substrate, the third magnetic body on the first magnetic body, and
a fourth magnetic body extending in the first direction on the second magnetic body,
wherein the first magnetic body and the second magnetic body extend in a second direction parallel to the top surface of the substrate, an easy axis of the first magnetic body and an easy axis of the second magnetic body are perpendicular to the second direction, and an easy axis of the third magnetic body and an easy access of the fourth magnetic body are parallel to the first direction.

16. The magnetic memory device of claim 9, wherein the magnetic tunnel junction is configured to perform at least one of a read operation or a write operation.

* * * * *